(12) United States Patent
Carlsen

(10) Patent No.: US 9,610,474 B1
(45) Date of Patent: Apr. 4, 2017

(54) BICYCLE TRAINER WITH ROLLER SPEED SENSOR

(71) Applicant: Kurt Manufacturing Company, Inc., Minneapolis, MN (US)

(72) Inventor: Paul Carlsen, Lino Lakes, MN (US)

(73) Assignee: KURT MANUFACTURING COMPANY, INC., Minneapolis, MN (US)

( * ) Notice: Subject to any disclaimer, the term of this patent is extended or adjusted under 35 U.S.C. 154(b) by 76 days.

(21) Appl. No.: 14/444,407

(22) Filed: Jul. 28, 2014

Related U.S. Application Data

(60) Provisional application No. 61/859,511, filed on Jul. 29, 2013.

(51) Int. Cl.
| | |
|---|---|
| A63B 71/00 | (2006.01) |
| A63B 22/06 | (2006.01) |
| A63B 69/16 | (2006.01) |
| A63B 24/00 | (2006.01) |

(52) U.S. Cl.
CPC ...... *A63B 22/0605* (2013.01); *A63B 24/0062* (2013.01); *A63B 2220/36* (2013.01)

(58) Field of Classification Search
CPC ............... A63B 22/00; A63B 22/0605; A63B 2022/0611; A63B 2022/0617; A63B 2022/0623; A63B 2022/0629; A63B 2022/0635; A63B 2022/0641; A63B 2022/0647; A63B 2022/0652; A63B 2022/0658; A63B 24/00; A63B 24/0062; A63B 2220/36; A63B 2069/161–2069/168; A63B 69/00; A63B 69/16

USPC .................................. 482/1, 8, 51, 57–65
See application file for complete search history.

(56) References Cited

U.S. PATENT DOCUMENTS

| | | | | |
|---|---|---|---|---|
| 4,934,692 A * | 6/1990 | Owens | ................... | A63B 24/00 482/6 |
| 5,585,437 A * | 12/1996 | Ohmae | ................. | C08L 71/123 525/133 |
| 6,418,797 B1 * | 7/2002 | Ambrosina | .............. | B62M 6/40 73/862.29 |
| 7,011,607 B2 * | 3/2006 | Kolda | ................ | A63B 21/0051 482/57 |
| 7,585,258 B2 * | 9/2009 | Watson | ................... | A63B 24/00 188/159 |
| 8,162,803 B2 * | 4/2012 | Schroeder | .......... | A63B 21/0052 482/1 |
| 8,395,291 B2 * | 3/2013 | Calley | ...................... | B62M 6/65 310/156.02 |
| 2005/0064999 A1 * | 3/2005 | Qiu | .................... | A63B 21/0051 482/57 |
| 2006/0234840 A1 * | 10/2006 | Watson | ................. | A63B 24/00 482/61 |

(Continued)

*Primary Examiner* — Stephen Crow
*Assistant Examiner* — Garrett Atkinson
(74) *Attorney, Agent, or Firm* — Steven M. Koehler; Westman, Champlin & Koehler, P.A.

(57) ABSTRACT

A bicycle trainer includes a roller support assembly and a roller positioned about the roller support assembly wherein the roller includes an aperture. A fixing member is disposed in the aperture to secure the roller to the roller support assembly allowing rotation of the roller. An element capable of being sensed disposed in the aperture and a sensor is positioned within the trainer at a stationary location wherein the sensor is configured to sense the element and provide a signal indicative of rotation of the roller.

22 Claims, 2 Drawing Sheets

(56) References Cited

U.S. PATENT DOCUMENTS

2008/0103030 A1\* 5/2008 Watson ................ A63B 24/00
 482/61

\* cited by examiner

BICYCLE TRAINER WITH ROLLER SPEED SENSOR

CROSS-REFERENCE TO RELATED APPLICATION(S)

The present application claims the benefit of U.S. Provisional Patent Application Ser. No. 61/859,511, entitled BICYCLE TRAINER WITH ROLLER SPEED SENSOR that was filed on Jul. 29, 2013, the contents of which are incorporated by reference in its entirety.

BACKGROUND

The discussion below is merely provided for general background information and is not intended to be used as an aid in determining the scope of the claimed subject matter.

The present disclosure relates generally to a roller speed sensor for a bicycle trainer. More particularly, the present disclosure relates to a first element positioned on a rotational component of a bicycle trainer that either senses a second element or is sensed by the second element that is positioned on a stationary component of the bicycle trainer.

Bicycle trainers have been used by bicycle enthusiasts to convert their bicycles for stationary riding, typically indoors. A typical user of a bicycle trainer is a bicycle owner who competes in various bicycles races or rides often. When in climate weather prevents riding outdoors, such as when it is raining, too cold, or too hot, the cyclist can use the trainer indoors to simulate a ride.

A common bicycle trainer has a frame onto which the user mounts the bicycle. Typically, the rear wheel of the bicycle is in contact with a roller that, in turn, is coupled to a resistance unit.

Another alternative bicycle trainer includes a frame that engages a back axle of the bicycle and supports the bicycle after the rear wheel is removed. With the back wheel removed, the drive chain is coupled to sprocket that is coupled to a resistance unit.

In order to track progress and performance, a cyclist may be interested in his/her speed and power output during a ride, both outdoors and on a trainer. A device called a power meter provides insight to the cyclists riding parameters, which can require the rotational speed of the pedals or tires.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

The present disclosure relates to a bicycle trainer that includes a roller support assembly and a roller positioned about the roller support assembly wherein the roller includes an aperture. A fixing member is disposed in the aperture to secure the roller to the roller support assembly allowing rotation of the roller. An element capable of being sensed disposed in the aperture and a sensor is positioned within the trainer at a stationary location wherein the sensor is configured to sense the element and provide a signal indicative of rotation of the roller.

Another aspect of the present disclosure relates to a bicycle trainer configured to sense a rotational speed of a rotating element. The bicycle trainer includes a stationary element and a rotating element supported by the stationary element. An element capable of being sensed is configured to be secured to either the stationary element or the rotating element. A sensor capable of sensing the element capable of being sensed is configured to be secured to the rotating element when the element is secured within the stationary element or the sensor is configured to be secured within the stationary element when the element is secured to the rotating element.

Although the subject matter has been described in language specific to structural features and/or methodological acts, it is to be understood that the subject matter defined in the appended claims is not necessarily limited to the specific features or acts described above as has been held by the courts. Rather, the specific features and acts described above are disclosed as example forms of implementing the claims.

DETAILED DESCRIPTION OF ILLUSTRATIVE EMBODIMENTS

Figure 1:
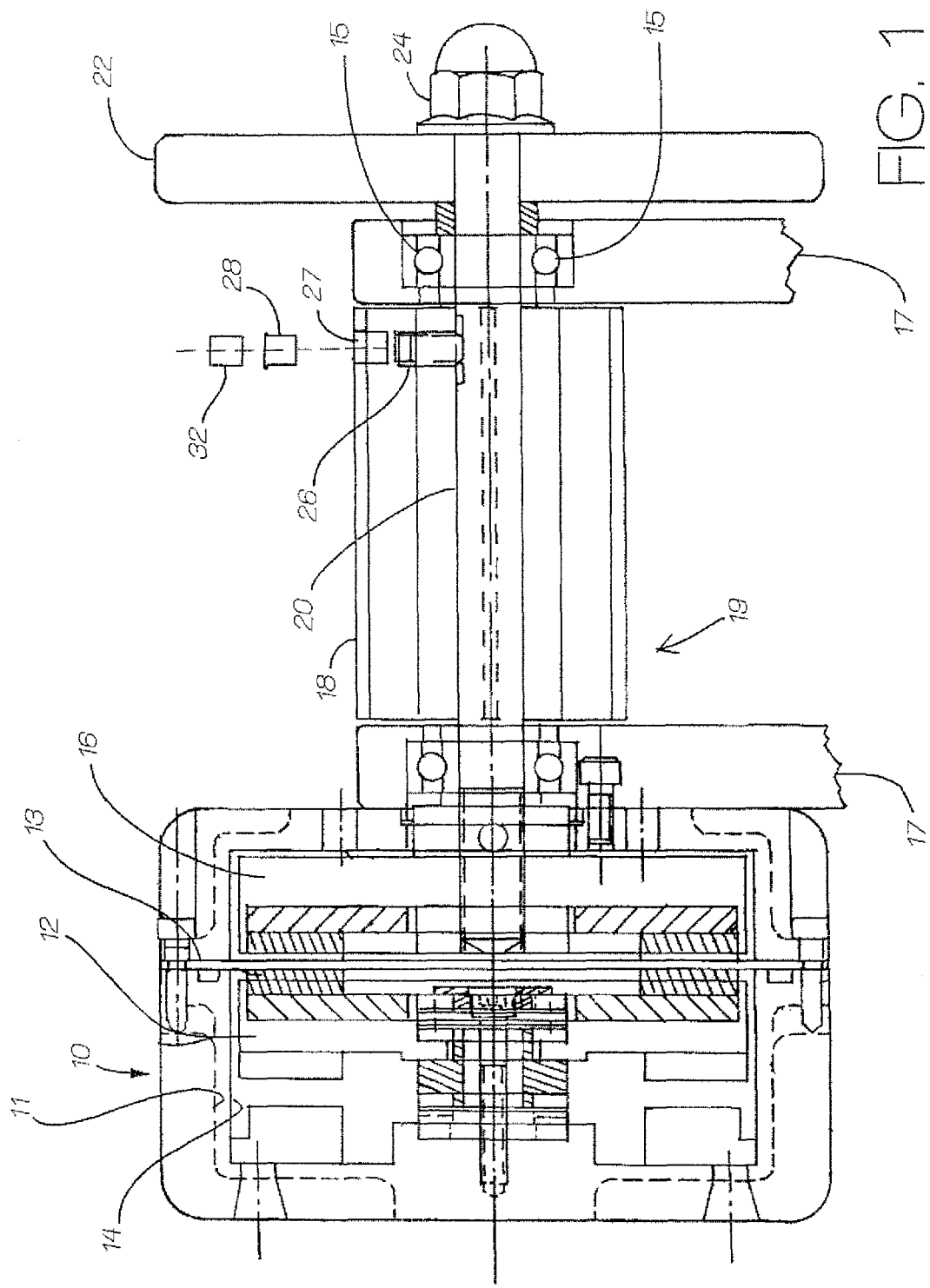
FIG. 1 is a view of a resistance device for a trainer with some parts shown in section.

FIG. 1 illustrates an exemplary resistance device 10 for a bicycle trainer (not shown, but an example of which is shown and described in U.S. Pat. No. 6,702,721, which is incorporated by reference in its entirety). Herein the resistance device 10 comprises an impeller unit 10 that includes an impeller 12 disposed within a fluid-filled chamber 14 formed by a bowl 11 and thin plate 13. The impeller 12 is magnetically coupled to a rotating member 16. Although illustrated wherein the resistance device comprises an impeller unit, it should be understood that this is but one embodiment and should not be considered limiting.

Figure 2:
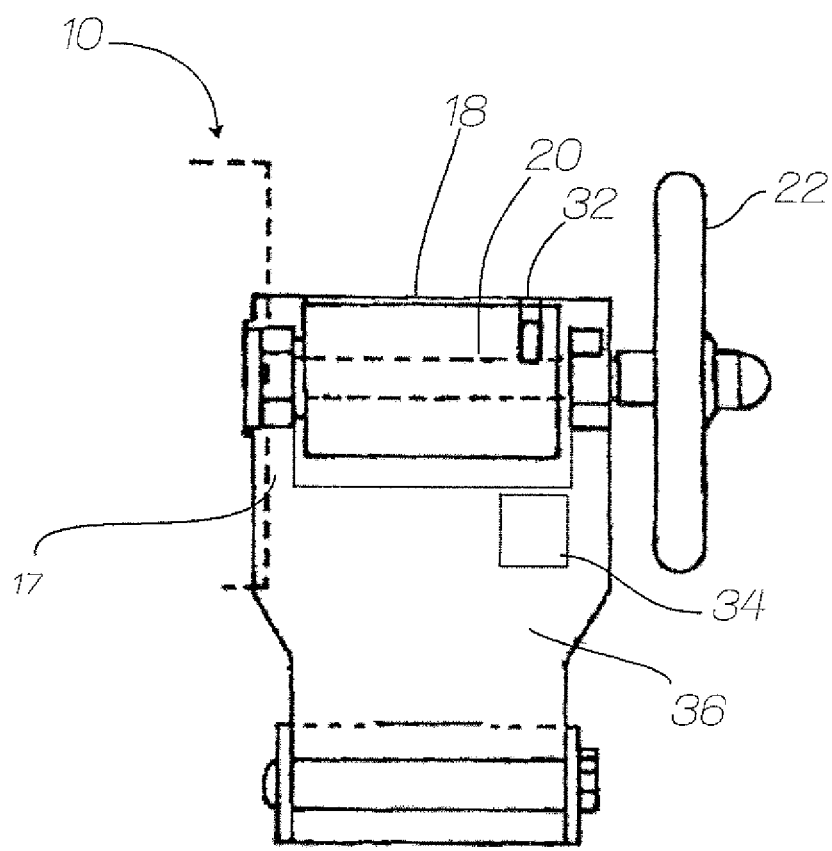
FIG. 2 is an elevational view of a support arm and the resistance device

Referring to FIGS. 1 and 2, a roller support assembly 19 includes a center shaft 20 fixedly connected at one end to the rotating member 16 and at an opposite end to a flywheel 22 with a nut 24. Bearings 15 mounted to supports 17 (herein also representing the complete trainer) support the shaft 20 and allow rotation thereof. In the embodiment illustrated, the supports 22 are provided on support arm 36; however, this should not be considered limiting.

Roller 18 is fixedly coupled to the roller support assembly 19 using a fixing member 26 that is inserted in an aperture 27 of the roller 18. An exemplary fixing member 26 comprises a set screw that threadably engages a threaded surface that defines the aperture 27 such that an end of the set screw frictionally engages the center shaft 20. A length of the set fixing member 26 is less than a length of the aperture 27 such that when the fixing member engages the roller assembly, an unoccupied portion or void remains in the aperture 27. Although the fixing member 26 as described herein comprises a set screw, other fixing members 26 are also contemplated including, but not limited to keys, pins, bolts or the like.

A magnet 32 is fixed to the roller 18 and a rotation of the roller 18 and shaft 20 is sensed by a sensor 34 that is mounted to a stationary support arm 36 of the trainer 10. FIG. 1 illustrates a particularly convenient location for mounting the magnet 32 to the roller 18, that being the unoccupied portion or space of the aperture 27 remaining after the fixing member 26 fixedly secures the roller 18 to the roller support assembly 19 (e.g. the center shaft 20). In one embodiment, the magnet 32 is sized so as to be flush, substantially flush or lower than an outer surface of the roller 18 so as not to protrude above the outer surface of the roller 18 in a manner that could cause damage or wear on the tire of the bicycle that engages the roller 18.

The magnet 32 can be secured in the aperture 27 using any suitable securing device or method such as but not limited to a friction fit with or without an adhesive. A particularly convenient method securing the magnet 32 within the aperture 27 is through the use of a mounting member 28, as illustrated in FIG. 1. The magnet 32 is positioned within the mounting member 28 and the mounting member 28 is of a size and material of construction to frictionally engage the inner surface of the aperture 27 with the magnet 32 disposed in an aperture (not shown) formed in the mounting member 28. Friction between the mounting member 28 and the aperture 27 may be particularly enhanced when the inner surface of the aperture 27 comprises threads for the set screw 26.

The securing of the magnet 32 in the mounting member 28 and/or mounting of the mounting member 28 in the aperture 27 can further include an adhesive, if desired. However, when an adhesive is not utilized between the mounting member 28 and the aperture 27, the mounting member 28 and the magnet 32 can be more easily removed to provide access to the set screw 26, when needed.

In one embodiment, the mounting member 28 comprises a flexible grommet made of a thermoplastic, an elastomer or combinations thereof that is capable of conforming to and frictionally engaging the surface defining the aperture 27. However, other materials of construction of the mounting member 28 are also contemplated.

As illustrated in FIG. 2, the sensor 34 can be mounted to the support arm 36 using a suitable fastener such as an adhesive. The sensor 34 senses a magnetic field of the passing magnet 32 as the roller 18 rotates. The sensor 34 then provides a signal to a monitoring device (not shown). The sensor 34 can include a reed switch or Hall effect sensing device, but also can take other forms, if desired. The monitoring device receives the signal provided by the sensor 34 to provide information indicative of power, cadence, speed, simulated distance traveled, etc. of the bicycle rider using the trainer.

While a magnet 32 is illustrated and disclosed as the element that is sensed, other sensing elements are also contemplated. Further, while the element being sensed is illustrated as being positioned with the roller 18 and the sensor 34 is illustrated being located in the stationary support arm 36, it is contemplated that the sensor 34 be located in the roller 18 (or some other rotating element of the bicycle trainer 10) and the element capable of being sensed, such as but not limited to the magnet 32, be located in a stationary component of the bicycle trainer 10, such as but not limited to the support arm 36.

When the sensor 32 is positioned within the stationary support arm 36, the signal from the sensor 32 can be transmitted through a hard wired connection or a wireless connection to the monitoring device (not shown). When the sensor 32 is positioned within a rotational element such as the roller 18, the signal from the sensor 32 is typically sent to the monitoring device (not shown) through a wireless connection.

Aspects of the present invention, and in particular, a roller having an aperture for a magnet, and a sensor to sense rotation of the magnet with the roller can be used on other exercise devices having rollers including but not limited to the trainers described and illustrated in US Published Patent Application 2013/0065734, which is hereby incorporated by reference in its entirety.

Although the subject matter has been described in language specific to structural features and/or methodological acts, it is to be understood that the subject matter defined in the appended claims is not necessarily limited to the specific features or acts described above as has been determined by the courts. Rather, the specific features and acts described above are disclosed as example forms of implementing the claims.

What is claimed is:

1. A bicycle trainer comprising:
   a flywheel;
   a roller support assembly having spaced-apart bearings;
   a roller supported by the roller support assembly to rotate about a rotation axis and having an aperture, the aperture extending radially relative to the rotation axis;
   a fixing member disposed in the aperture to secure the roller to the roller support assembly allowing rotation of the roller;
   an element capable of being sensed disposed in the aperture, wherein the element is flush, substantially flush or lower than an outer surface of the roller; and
   a sensor positioned within the trainer at a stationary location wherein the sensor is configured to sense the element and provide a signal indicative of rotation of the roller.

2. The bicycle trainer of claim 1 wherein a surface defining the aperture includes threads.

3. The bicycle trainer of claim 2 and wherein the fixing member comprises a set screw having threads that threadably engages the surface defining the aperture such that the set screw frictionally engages the roller support assembly and the aperture comprises threads wherein the set screw is a length that is less than a length of the aperture such that when the set screw frictionally engages the roller support assembly, the aperture includes an unoccupied space that is configured to accept the element.

4. The bicycle trainer of claim 1 and wherein the element capable of being sensed is a magnet having a magnetic field.

5. The bicycle trainer of claim 1 and further comprising a mounting member configured to accept the element capable of being sensed wherein the mounting member is configured to engage a surface defining the aperture.

6. The bicycle trainer of claim 5 wherein the mounting member comprises a grommet.

7. The bicycle trainer of claim 5 wherein the mounting member is constructed of a thermoplastic, an elastomer or combinations of a thermoplastic and an elastomer.

8. The bicycle trainer of claim 1 and wherein the sensor comprises a reed switch or Hall effect sensing device.

9. The bicycle trainer of claim 1 wherein when the element is positioned within the aperture completely such that a top surface of the element is flush or lower than the outer surface of the roller.

10. A bicycle trainer configured to sense a rotational speed of a rotating element, the bicycle trainer comprising:
    a stationary element having spaced-apart bearings;
    a rotating element supported by the bearings of the stationary element to rotate about a rotation axis, and having a roller having an aperture;
    an element capable of being sensed, the element capable of being sensed is configured to be secured to either the stationary element or the rotating element between the bearings and within the aperture radially with respect to the rotation axis; and a sensor configured to sense the element capable of being sensed wherein the sensor is configured to be secured to the rotating element between the bearings and within the aperture radially with respect to the rotation axis when the element capable of being sensed is secured to the stationary element or the sensor is configured to be secured to the stationary element when the element capable of being sensed is secured to the rotating element, wherein when the element capable of being sensed is positioned within the aperture it is positioned such that a top surface of the element is flush, substantially flush or lower than an outer surface of the roller.

11. The bicycle trainer of claim 10 and wherein the rotating element comprises:

a shaft;

the roller having a bore to receive the shaft; and a fixing member disposed in the aperture to secure the roller to the shaft.

12. The bicycle trainer of claim 11 and wherein the element capable of being sensed is configured to be positioned within the aperture.

13. The bicycle trainer of claim 12 and further comprising a mounting member configured to accept the element capable of being sensed wherein the mounting member is configured to engage a surface defining the aperture.

14. The bicycle trainer of claim 13 wherein the mounting member comprises a grommet.

15. The bicycle trainer of claim 11 wherein a surface defining the aperture includes threads.

16. The bicycle trainer of claim 15 and wherein the fixing member comprises a set screw having threads that threadably engages the surface defining the aperture such that the set screw frictionally engages the shaft and the aperture comprises threads wherein the set screw is a length that is less than a length of the aperture such that when the set screw frictionally engages the shaft, the aperture includes an unoccupied space that is configured to accept the element capable of being sensed.

17. The bicycle trainer of claim 10 wherein the sensor is configured to sense the element capable of being sensed and provide a signal indicative of rotation of the roller.

18. The bicycle trainer of claim 10 and wherein the element capable of being sensed is a magnet having a magnetic field.

19. The bicycle trainer of claim 10 and wherein the sensor comprises a reed switch or Hall effect sensing device.

20. The bicycle trainer of claim 10 wherein when the element capable of being sensed is positioned within the aperture it is positioned completely in the aperture such that the top surface of the element is flush or lower than the outer surface of the roller.

21. A resistance device for a bicycle trainer, the resistance device comprising:

a roller support assembly having spaced-apart bearings;

a roller coupled to the roller support assembly, the roller having a mounting member with an aperture and configured to rotate about a rotation axis;

a magnet disposed within the aperture, wherein the magnet in the aperture is positioned below an outer cylindrical surface of the roller, and wherein the magnet and the aperture are disposed on the roller between the spaced-apart bearings;

and a sensor magnetically coupled to the magnet to sense rotation of the roller, the sensor having an adhesive to mount the sensor to a support member of the resistance device.

22. The resistance device of claim 21, wherein the magnet is configured to frictionally engage an inner surface of the aperture.

* * * * *